(12) United States Patent
Appelt et al.

(10) Patent No.: US 6,734,569 B2
(45) Date of Patent: May 11, 2004

(54) DIE ATTACHMENT WITH REDUCED ADHESIVE BLEED-OUT

(75) Inventors: Bernd Karl Appelt, Endicott, NY (US); Gary Alan Johansson, New Castle, DE (US); Konstantinos I. Papathomas, Endicott, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/316,267

(22) Filed: Dec. 12, 2002

(65) Prior Publication Data

US 2003/0119226 A1 Jun. 26, 2003

Related U.S. Application Data

(62) Division of application No. 09/114,725, filed on Jul. 13, 1998, now abandoned.

(51) Int. Cl.$^7$ .................. H01L 23/48; H01L 23/52; H01L 29/40; B32B 33/00; B05B 31/00
(52) U.S. Cl. .................. 257/783; 156/90; 156/279; 156/327; 156/330; 438/118
(58) Field of Search .................. 438/118; 257/783; 156/90, 279, 327, 330

(56) References Cited

U.S. PATENT DOCUMENTS

| | | |
|---|---|---|
| 4,161,478 A | 7/1979 | Crivello |
| 4,769,399 A | 9/1988 | Schenz |
| 4,975,221 A | 12/1990 | Chen et al. |
| 5,110,388 A | 5/1992 | Komiyama et al. |
| 5,118,567 A | 6/1992 | Komiyama et al. |
| 5,130,229 A | 7/1992 | Chang et al. |
| 5,143,785 A | 9/1992 | Pujol et al. |
| 5,155,066 A | * 10/1992 | Nguyen |
| 5,261,156 A | 11/1993 | Mase et al. |
| 5,356,947 A | 10/1994 | Ali et al. |
| 5,356,949 A | 10/1994 | Komiyama et al. |
| 5,371,178 A | 12/1994 | Nguyen |
| 5,409,863 A | 4/1995 | Newman |
| 5,523,374 A | 6/1996 | Bard et al. |
| 5,524,422 A | 6/1996 | Nguyen |
| 5,539,012 A | 7/1996 | Klemarczyk |
| 5,565,499 A | 10/1996 | Klemarczyk |
| 5,582,772 A | 12/1996 | Kwak |
| 5,585,414 A | 12/1996 | Klemarczyk |
| 5,679,719 A | 10/1997 | Klemarczyk |
| 5,708,129 A | 1/1998 | Nguyen et al. |

FOREIGN PATENT DOCUMENTS

EP 0708582 A1 4/1996

OTHER PUBLICATIONS

Chien et al., "Low Stress Polymer Die Attach Adhesive for Plastic Packages", Electronic Components & Technology Conference, May 1994.
Burkhart et al., "Defining Die Attach Requirements for Fine Pitch Packaging".
Burkhart et al, Novel Snap Cure Die Attach for In–Line Processing.
Chien et al., "Low Stress Polymer Die Attach Adhesive for Plastic Packages".
Chien et al., "Low Stress Polymer Die Attach Adhesive for Plastic Packages", 1994.
Galloway, "Reliability of Novel Die Attach Adhesive for Snap Curing", Proceedings of IEMT '95 Symposium, 1995.
Nuygen et al., "Polycyanate Die–Attach Adhesives for Micorelectronic Applications", 1995.

* cited by examiner

Primary Examiner—Jack Chen
Assistant Examiner—Nema Berezny
(74) Attorney, Agent, or Firm—Connolly Bove Lodge & Hutz LLP; Arthur J. Samodovitz

(57) ABSTRACT

An organic chip carrier having metallic circuitry and wire bond pads thereon is bonded to an integrated circuit die by a photocurable adhesive and is electrically connected therewith by wire bonding to the wire bond pads.

12 Claims, 1 Drawing Sheet

DIE ATTACHMENT WITH REDUCED ADHESIVE BLEED-OUT

CROSS REFERENCE TO RELATED APPLICATION

The present application is a divisional of U.S. patent application Ser. No. 09/114,725 filed July 13, 1998 ABN.

TECHNICAL FIELD

The present invention is concerned with adhesively bonding a die to an organic chip carrier, and is especially concerned with significantly reducing, if not entirely eliminating, the problem of adhesive bleed-out. The present invention is concerned with adhesively bonding a die to an organic chip carrier along with assuring that the metallic surface on the chip carrier remains wire bondable. The present invention provides for reducing die attach adhesive separation and thereby reducing contamination and/or staining of substrate surfaces due to the adhesive. The present invention also relates to adhesive compositions that exhibit reduced bleed-out.

BACKGROUND OF INVENTION

Packaging techniques for integrated circuits have been developed with an emphasis on miniaturization. Improved methods enable integrating millions of transistor circuit elements into single integrated semiconductor embodied circuits or chips, and has resulted in increased emphasis on methods to package these circuits in space efficient, yet reliable and mass producible packages.

Forming an electronic system requires combining a plurality of integrated circuits and electrically connecting integrated circuits together. Once connected, other devices such as keyboards, video monitors and printers may be connected to and utilized with the electronic system.

In order to accomplish this interconnection, conductive paths must be made available to connect the internal circuitry of the integrated circuit die to external system electrical circuits. The integrated circuit die uses metallized bumps or "bond pads" which are connected to the integrated circuits of the die.

The integrated circuit package contains conductors referred to as "bond fingers" that are interconnected to the bond pads of the integrated circuit die by wire bonding, tape automated bonding ("TAB"), wedge bonding, ball bonding or other known methods. The bond fingers are connected to the integrated circuit package pins that are used to connect to printed circuit boards or cards.

Before the integrated circuit die bond pads are connected to the integrated circuit package, the die must be attached to the package assembly. Organic adhesives, such as, for example an epoxy-based adhesive, an acrylic-based adhesive or a silicone has been used for attachment of the die to the package assembly. Typical epoxy adhesives also include silver filler particles for protecting against sparking.

Although the adhesives used are relatively viscous, they nevertheless have a propensity to bleed and spread out away from the point of attachment. For example, the adhesive has a tendency to bleed-out along the periphery of the die attachment area and spread out over adjacent areas such as bond finger areas where electrical connections ultimately need to be made.

Various methods for reducing resin bleed have been developed. For example, the chip carrier surface may have a recess at the point of attachment of the die, such that the die and adhesive will be recessed below the adjoining areas of the chip carrier where electrical bonding sites are located. As a drawback to this method, not all integrated circuit assemblies provide the option of a recess cavity in the carrier surface. Very large scale integrated circuit (VLSI) assemblies, for example, require a large number of bonding sites and these are at the same level as the die attachment surface.

U.S. Pat. No. 5,409,863 suggests a method for controlling adhesive spread during a die-attach process. This method incorporates a low profile barrier, such as a solder mask ring, into the chip carrier structure. The barrier surrounds the periphery of the die attachment area, preventing the spread of adhesive resin onto the adjacent bonding sites on the chip carrier.

Also, attempts to deal with this problem have included plasma cleaning after the-die attachment. However, such technique has not been especially effective in eliminating bleed-out of the adhesive. It has also been suggested to treat surfaces with fluorinated coupling agents or other types of surfactants in order to render the surfaces non-wettable to the adhesive resin. However, these processes must be carefully controlled and are extremely time consuming and relative expensive. Furthermore, the shelf life of surfaces treated in such manner is typically rather limited, from hours to a few days, further restricting their use.

It would therefore be desirable to provide a technique for preventing adhesive spreading of die attachment onto adjacent bond fingers when fabricating semiconductor integrated circuit dies along with the integrated circuit package.

SUMMARY OF INVENTION

The present invention provides for reducing contamination and/or staining of substrate surfaces by the bonding adhesive. Moreover, the present invention provides a process that does not significantly increase the time and/or expense of the die attach process.

According to the present invention, an organic chip carrier having metallic circuitry and wire bond pads thereon is bonded to an underlying die by a photocurable adhesive and electrically interconnected together with wire bonding to the wire bond pads.

In addition, the present invention is also concerned with a method of fabricating a semiconductor integrated package whereby the integrated circuit adhesive does not spread out onto bond finger connections of the package. The method of the present invention comprises providing an adhesive on bond areas of an integrated circuit chip carrier. The adhesive is a photocurable adhesive composition. The composition is exposed to actinic radiation in order to render the adhesive bleed-free. The integrated circuit die is placed over the adhesive pattern so as to produce an adhesive fillet along the die edge. The adhesive can be subjected to the actinic radiation prior to or after the die placement since the exposure to actinic radiation imparts cross-linking to the composition thereby preventing spreading of the resin but does not fully harden the adhesive and thereby permitting it to retain sufficient adhesive strength to create a bond between the die and even if attached after subjecting to the actinic radiation.

After the die is assembled with the organic chip carrier and the exposure to actinic radiation is carried out, the assembly is subjected to a post-bake at elevated temperatures in order to fully cure and harden the adhesive and create the necessary adhesive bond between the organic chip carrier and integrated circuit die.

The present invention also relates to compositions suitable for use in the above-described process. Compositions of the present invention exhibit dual curing characteristics along with stable shelf-life. Moreover, the compositions are photocurable and are rendered free from resin bleed upon curing with actinic radiation. More particularly, the compositions comprise:

A. An epoxy component that includes at least one polyepoxide resin curable by heat;
B. An olefinically unsaturated monomer component that includes at least one polyolefinically unsaturated monomer curable by actinic radiation;
C. At least one cyanate ester;
D. At least one photoinitiator;
E. At least one organic peroxide; and
F. At least one heat activated curing agent selected from the group consisting of organo-metallic compounds, inorganic metal salts, phenolic compounds; solutions of organo-metallic compounds in phenolic compounds; and mixtures thereof.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
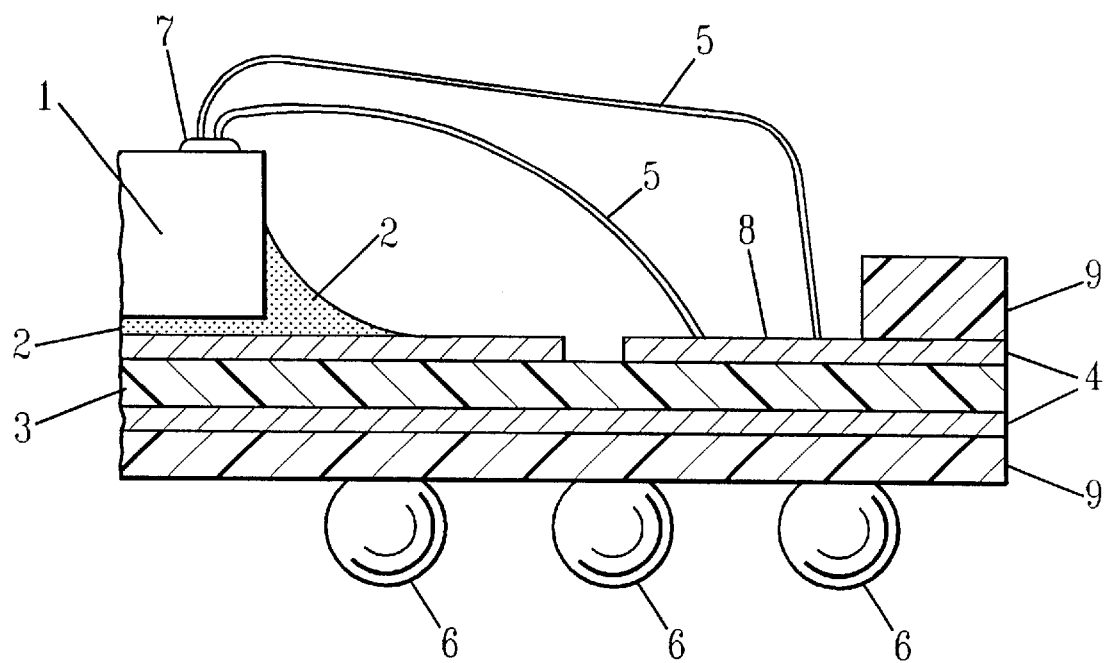
FIG. 1 is a partial schematic diagram of a structure prepared according to the present invention.

Referring to the drawing facilitates an understanding of the present invention. In particular, the FIGURE is a partial schematic diagram of a structure according to the present invention. In particular, the integrated circuit package comprises an integrated circuit die 1, an adhesive 2 present on the integrated circuit die 1 and attached to the integrated circuit carrier 3 which contains bond fingers 8.

The integrated carrier is connected electrically to the integrated circuit die 1 at bond pads 7 through the wire bond connection 5. The bond fingers are connected by conductors 4 through dielectric 9 to pads or lands (not shown) for solder balls 6. The solder balls in turn are connected to the system level circuit board or card (not shown).

According to the present invention, the photocurable die attach adhesive is dispensed on the substrate in an amount and pattern so as to provide proper fillet formation and a sufficient bond in the subsequent die attach steps. The photocurable adhesive composition is preferably a cationically curable composition. Free radical based compositions can also be employed. Compositions employed in the present invention exhibit dual curing characteristics and especially being heat curable in addition to being curable by actinic radiation. Examples of suitable photocurable compositions are photosensitive epoxy polymer compositions, photosensitive curable cyanate ester compositions or combinations thereof.

Suitable cyanate ester components include at least one cyanate ester compound (monomer, oligomer, or polymer).

Preferably, the cyanate ester component comprises at least one cyanate ester compound (monomer, oligomer, or polymer). More preferably, the cyanate ester component comprises at least one compound having two or more —OCN functional groups per molecule. The molecular weights of suitable cyanate ester compounds are typically about 150 to about 2000. The cyanate ester component preferably includes one or more cyanate ester compounds according to Formula I, II or III.

Formula I is

$$Z(\text{---OCN})_q \quad (I)$$

wherein q can be an integer from 2 to 7 and wherein Z comprises at least one of: (1) a mono-, di-, tri-, or tetrasubstituted aromatic hydrocarbon containing 5 to 30 carbon atoms, and (2) a mono-, di-, tri-, or tetrasubstituted aliphatic hydrocarbon containing 7 to 20 carbon atoms. Optionally, (1) and (2) may contain 1 to 10 heteroatoms selected from the group consisting of non-peroxidic oxygen, sulfur, non-phosphino phosphorous, non-amino nitrogen, halogen, and silicon.

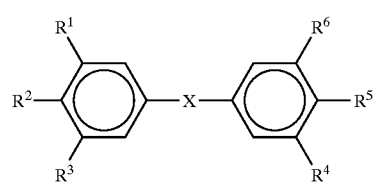

II where X is a single bond, a $C_1$-$C_4$ alkylene group, —S—, or the —$SO_2$— group; and where $R^1$, $R^2$, $R^3$, $R^4$, $R^5$, and $R^6$ are independently —H, a $C_1$-$C_5$, alkyl group, or the cyanate ester group (—OCN), with at least two of $R^1$, $R^2$, $R^3$, $R^4$, $R^5$ and $R^6$ being the cyanate ester group. $R^1$, $R^2$, $R^3$, $R^4$, $R^5$ and $R^6$ are preferably —H—, —$CH_3$ or cyanate ester group.

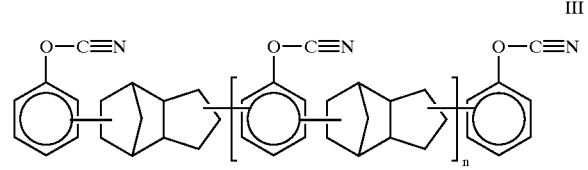

III where n is 0 to 5.

The cyanate esters useful in the invention may be employed in amounts ranging from about 25% by wt. to about 50% wt. based upon the total weight of the polymerizable components of the composition. The cyanate ester component may be present as a single cyanate ester, preferably having at least two —OCN functional groups per molecule, or as a mixture of cyanate esters, preferably including at least one dicyanate ester. Preferred cyanate esters useful in the present invention include the polyaromatic cyanate esters, such as the dicyanate esters of bisphenols. Especially preferred cyanate esters include the dicyanate esters of bisphenol A, such as the AroCy B-10 cyanate ester monomer, the dicyanate esters of tetramethylbisphenol F, such as AroCy M-10, and the dicyanate esters of bisphenol E, such as AroCy L-10, all available from Ciba. Alternatively, a semisolid dicyanate oligomer of bisphenol A may be employed in conjunction with a cyanate ester of lower viscosity. An especially preferred cyanate ester oligomer is the dicyanate oligomer of bisphenol A, such as the AroCy B-30 semisolid resin available from Ciba.

Epoxy resins suitable in the compositions of the present invention include polyepoxides curable by elevated temperature. Examples of these polyepoxides include polyglycidyl and poly-(b-methylglycidyl) ethers obtainable by reaction of a compound containing at least two free alcoholic hydroxyl and/or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,2-diol, butane-1,4-diol, poly(oxytetramethylene) glycols, pentane-1,5-diol, hexane-2,4,6-triol, glycerol, 1,1,1-trimethylolpropane, pentaerythritol, sorbitol, and poly (epichlorohydrin); from cycloaliphatic alcohols such as resorcinol, quinitol, bis(4-hydroxycyclohexyl)methane, 2,2-bis(4-hydroxycyclohexyl)propane, and 1,1-bis (hydroxymethyl)cyclohex-3-ene; and from alcohols having aromatic nuclei, such as N,N-bis(2-hydroxyethyl)aniline and p,p'-bis(2-hydroxyethylamino)diphenylmethane. Also, they may be made from mononuclear phenols, such as resorcinol and hydroquinone, and from polynuclear phenols, such as bis(4-hydroxyphenyl)methane, 4,4-dihydroxydiphenyl, bis(4-hydroxyphenyl sulphone, 1,1,2,2-tetrabis(4-hydroxyphenyl)ethane, 2,2-bis(4-hydroxyphenyl) propane, 2,2-bis(3,5-dibromo-4-hydroxyphenyl)propane, and novolaks formed from the combination of aldehydes, such as formaldehyde, acetaldehyde, choral, and furfuraldehyde, with phenols, such as phenol itself, and phenols substituted on the ring by chlorine atoms or by alkyl groups each containing up to nine carbon atoms such as 4-chlorophenol, 2-methylphenol, and 4-t-butylphenol.

Poly(N-glycidyl) compounds include, for example, those obtained by dehydrochlorination of the reaction products of epichlorohydrin with amines containing at least two amino hydrogen atoms, such as aniline, n-butylamine, bis(4-aminophenyl)methane, and bis(4-methylaminophenyl) methane; triglycidyl isocyanurate; and N,N'-diglycidyl derivatives of cyclic alkylene ureas, such as ethyleneurea and 1,3-propyleneureas, and of hydantoins such as 5,5-dimethylhydantoin.

Such epoxies are available from a variety of commercial sources, such as the Epon series from Shell Chemical Co., the Epirez series from Rhone-Poulenc, the Araldite series from Ciba and the DER series from Dow Chemical Co.

Also useful are halogenated epoxy resins such as the brominated epoxides available from the sources shown above. Halogenated epoxy resins in combination with other fire retardant materials may be suitable for use as fire retardant additives in the compositions of the present invention.

Especially preferred epoxy resins useful in the present invention are the glycidyl ethers of bisphenol A marketed under the tradenames Epon 825 and Epon 828 available from Shell chemical Co., DER 331 and 332 available from Dow Chemical Co. and the cycloaliphatic epoxy resin marketed as ERL-4221 and ERL-4299 by Union Carbide Co.

Various epoxies such as the glycidyl ethers marketed as the EPODIL series by Pacific Anchor Chemical Corporation, a division of Air Products and Chemicals, Inc. may be added as epoxy diluents, to reduce the viscosities of the resins of the present invention.

Epoxy compounds are included in the resin compositions of the invention in an amount of from about 25 to 70% by wt., preferably from about 30 to 60% by wt. of the total content of the polymerizable components of the composition.

Suitable polyolefinically unsaturated components of the compositions may include poly(meth)acrylic resins, polyvinyl monomers, and polyunsaturated polyesters solubilized in vinyl monomers. As used herein, the term "(meth)acrylic" is intended to be broadly construed to include acrylic as well as methacrylic compounds, e.g., acrylic esters and methacrylic esters.

It is preferred that the polyolefinically unsaturated monomer have a low viscosity to offset the effect of any higher viscosity component so as to retain the low composition viscosity required for effective use of fillers metallic or non-metallic. In addition, the polyolefinically unsaturated monomer component may comprise one or more low viscosity monoolefinically unsaturated monomers as diluent, but in any event, the olefinically unsaturated monomer component must comprise at least one polyolefinically unsaturated monomer. As used herein, "polyolefinically unsaturated" means having at least two olefinic double bonds. The polyolefinically unsaturated monomers may be used in amounts of from about 5 to 30% and preferably from about 15 to about 25% by weight of the composition based upon the total content of the polymerizable components of the composition.

Polyacrylates are generally useful, including 1,3-butylene glycol diacrylate, diethylene glycol diacrylate, 1,6-hexanediol diacrylate, neopentylglycol diacrylate, polyethylene glycol diacrylate, tetraethylene glycol diacrylate, methylene glycol diacrylate, pentaerythritol tetraacrylate, tripropylene glycol diacrylate, ethoxylated bisphenol A diacrylate, trimethylolpropane triacrylate, di-trimethylolpropane tetraacrylate, dipenterythritol pentaacrylate, pentaerythritol triacrylate and the corresponding methacrylate compounds. Also useful are reaction products of (meth)acrylic acid and epoxide resins and urethane resins. Some typical photocurable reaction products of monoethylenically unsaturated acid such as acrylic or methacrylic acid and various epoxides are those disclosed in U.S. Pat. Nos. 4,169,732; 3661,576; 3,989,610; 3,772,062; 3,912, 670; 3,450,613; 4,003,877; 4,014,771 and 4,237,216, disclosures of which are incorporated herein by reference. Other suitable poly(meth)acrylic ester compounds are also described in U.S. Pat. Nos. 4,051,195; 2,895,950; 3,218,305 and 3,425,988.

Useful (meth)acrylic resins include esters and amides of (meth)acrylic acid as well as comonomers thereof with other copolymerizable monomers. Illustrative esters include methyl acrylate, methyl methacrylate, hydroxyethyl acrylate, butyl methacrylate, octyl acrylate, and 2-epoxyethylacrylate.

Another class of resins which are actinic radiation curable and potentially suitable for use in the compositions in the invention include vinyl monomers such as styrene, vinyl toluene, vinyl pyrrolidone, vinyl acetate, divinyl benzene, and the like.

A further useful class of actinic radiation curable resin materials comprises unsaturated polyesters, solubilized in vinyl monomers, as ordinarily prepared from alpha-beta ethylenically unsaturated polycarboxylic acids and polyhydric alcohols, as described for example in U.S. Pat. No. 4,025,407.

Preferred polyolefinically unsaturated components include trimethylolpropane trimethacrylate, triethylolpropane triacrylate, dipentaerythritol pentaacrylate, pentaerythritol triacrylate, ethoxylated trimethylolpropane triacrylate, 1,6-hexanediol diacrylate, neopentyl glycol diacrylate, pentaerythritol tetraacrylate, and 1,3-butylene glycol diacrylate. Preferred monoacrylates include cyclohexylacrylate, 2-ethoxyethyl acrylate, 2-methoxy acrylate, benzoyl acrylate, and isobornyl acrylate. Such compounds are available from a variety of sources. For example, a preferred polyacrylate, dipentaerythritol monohydroxypentaacrylate, is available as SR 399 from Sartomer Co.

Compositions employed according to the present invention also typically include an organic peroxide. Useful peroxides include various peroxyesters such as a-cumylperoxy-neodecanoate, 1,1-dimethyl-3-hydroxy-butylperoxyneodecanoate, a-cumylperoxyneoheptanoate, t-amyl-peroxyneodecanoate, t-butylperoxyneodecanoate, t-amyl-peroxyneodecanoate, t-butylperoxyneodecanoate, t-amyl-peroxypivalate, t-butylperoxypivalate, 1,1-dimethyl-3-hydroxy-butylperoxy-2-ethylhexanoate, 2,5-dimethyl-2,5-di(2-ethylhexanoylperoxy) hexane, t-amylperoxy-2-ethylhexanoate, t-butylperoxy-2-ethylhexanoate, t-butylperoxyisobutyrate, t-butylperoxymaleic acid, t-butylperoxyacetate, t-amylperoxyacetate and t-amylperoxy-benzoate.

Preferred organic peroxides include lauroyl peroxide, t-amylperoxy-2-ethylhexanoate and 1,1-di(butylperoxy)-3,3,5-trimethylhexane. Lauroyl peroxide is available as Alperox-F, t-amylperoxy-2-ethylhexanoate is available as Lupersol 575; and 1,1-di(t-butylperoxy)-2,2,5-trimethylhexane is available as Lupersol 256, all available from Elf Atochem North America, Inc.

Organic peroxides are generally present in the compositions of the invention in an amount of from about 0.2 to about 2% by weight based upon the resin composition.

Actinic radiation means electromagnetic radiation having a wavelength of about 700 nm or less which is capable, directly or indirectly, of curing the specified resin component of the resin composition. By indirect curing in this context is meant curing under such electromagnetic radiation conditions, as initiated, promoted, or otherwise mediated by another compound.

Accordingly, a photoinitiator may be added to the composition in an amount effective to respond to the actinic radiation and to initiate and induce curing of the associated resin, via substantial polymerization thereof. Suitable photoinitiators useful with ultraviolet (UV) actinic radiation curing mono- and polyolefinic monomers include free radical generating UV initiators such as benzophenone and substituted benzophenones, acetophenone and substituted acetophenones, benzoin and its alkyl esters and xanthone and substituted xanthones. Preferred photoinitiators include diethoxy-acetophenone, benzoin methyl ether, benzoin ethyl ether, benzoin isopropyl ether, diethoxyxanthone, chlorothio-xanthone, azo-bisisobutyronitrile, N-methyl diethanolaminebenzophenone, and mixtures thereof.

Suitable photo-initiators and sensitizers include cationic initiators which typically generate a Bronsted acid upon exposure to actinic light. Examples of some suitable cationic photo-initiators which generate a Bronsted acid include onium salts and especially group VIA and group VIIA salts such as byrylium, selenonium, sulfonium and iodonium salts. Various suitable photo-initiators are discussed in U.S. Pat. Nos. 4,161,478; 4,442,197; 4,139,655; 4,400,541; 4,197,174; 4,173,476 and 4,299,938, disclosures of which are incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphase", Journal of Polymer Science: Polymer Chemistry Edition, Vol. 22, p. 1789 (1980), John Wiley & Sons, Inc.

Additional discussions concerning sulfonium and iodonium salts can be found, for instance, in Crivello, et al., "Complex Triarylsulfonium Salt Photoinitiators. II. The Preparation of Several New Complex Triarylsulfonium Salts and the Influence of Their Structure in Photoinitiated Cationic Polymerization", Journal of Polymer Science: Polymer Chemistry Edition, Vol. 18, pp. 2697–2714 (1980), John Wiley & Sons, Inc.; Pappas, et al., "Photoinitiation of Cationic Polymerization. III. Photosensitization of Diphenyliodonium and Triphenylsulfonium Salts", Journal of Polymer Science: Polymer Chemistry Edition, Vol. 22, pp. 77–84 (1984), John Wiley & Sons, Inc.; Crivello, et al., "Photoinitiated Cationic Polymerization with Triarylsulfonium Salts", Journal of Polymer Science: Polymer Chemistry Edition, Vol. 17, pp. 977–999 (1979), John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators", Journal of Polymer Science: Polymer Chemistry Edition, Vol. 18, pp. 2677–2695 (1980), John Wiley & Sons, Inc.; and Crivello, "Cationic Polymerization-Iodonium and Sulfonium Salt Photoinitiators", Advances in Polymer Science, Series #62, pp. 1–48 (1984), Springer-Verlag.

The preferred photoacid generators or initiators are triflic acid generators and substituted and unsubstituted diaryl and triarylsulfonium and iodonium salts.

Compounds that generate triflic acid include onium salts such as diphenyl-iodonium triflate, di-(t-butyl phenyl) iodonium triflate and triphenylsulfonium triflate and non-ionic compounds such as phthalimide triflate.

Mixtures of diphenyl-iodonium triflate, di-(t-butyl-phenyl)iodonium triflate, or phthalimide triflate can be used.

Aromatic iodonium salts which can be employed in accordance with this invention thus include those having the formulae:

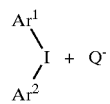

wherein $Ar^1$ and $Ar^2$ are aromatic groups having 4 to 20 carbon atoms and are preferably selected from phenyl, naphthyl, thienyl, and furanyl groups; and $Q^-$ is any anion, but preferably is an anion selected from tetrafluoroborate, hexafluorophosphate, hexafluoroarsenate, hexafluoroantimonate, trifluoromethanesulfonate or trifluoroacetate.

Among the useful iodonium salts are particularly included:

diphenyliodonium hexafluoroarsenate
diphenyliodonium hexafluoroantimonate
diphenyliodonium hexafluorophosphate
diphenyliodonium trifluoroacetate
4-trifluoromethylphenylphenyliodonium tetrafluoroborate
ditolyliodonium hexafluorophosphate
di(4-methoxyphenyl)iodonium hexafluoroantimonate
diphenyliodonium trifluoromethane sulfonate
di(t-butylphenyl iodonium hexafluoroantimonate
di(t-butylphenyl iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate 2,2'-diphenyliodonium hexafluorophosphate.

Other curing agents useful in the energy polymerizable compositions of the present invention comprise an organo-metallic compound having metal atoms selected from the elements of Periodic Groups IVB (Ti, Zr, Hf), VB (V, Nb, Ta), VIB (Cr, Mo, W), VIIB (Mn, Tc, Re) and VII (Fe, Ru, Os, Co, Rh, Ir, Ni, Pd, Pt) which are commonly referred to as transition metals.

Visible light initiators include camphoroquinone peroxyester initiators and 9-fluorene carboxylic acid peroxyesters. Particularly preferred photoinitiators include 2-hydroxy-2-methyl-1-phenyl-propan-1-one available as Darocur 1173 from EM Industries, Inc., and 2-benzyl-2-(dimethylamino)-1-[4-(4-morpholinyl)phenyl]-1-butanone available as Irgacure 369 and Irgacure 261 from Ciba.

The photoinitiator employed is present in an amount sufficient to initiate the photochemical reaction. Usually the amount of photoinitiator is about 0.1 to about 10 percent by weight and preferably about 0.4 to about 1.0 percent by weight based upon the weight of the resin composition on a dry basis.

Catalysts suitable in practicing the present invention include heat activated catalysts capable of accelerating curing of the cyanate resin component. Examples of such catalysts include organo-metal compounds such as lead naphthenate, lead stearate, zinc naphthenate, zinc octylate, tin oleate, stannous laurate, dibutyltin maleate, manganese naphthenate, cobalt naphthenate, acetylacetonate iron, etc., inorganic metal salts such as $SnCl_3$, $ZnCl_2$ and $AlCl_3$; phenolic compounds such as phenol, xylenol, cresol, resorcinol, catechol and fluoroglycine; and solutions of an organo-metal component including one or more organo-metal compounds, in a phenolic component.

In this preferred embodiment, the organo-metal component may be present in an amount of from about 0.01% to about 1.0% of the resin composition on a solids basis. The phenolic component may be present in the resin composition in amounts ranging from about 0.5 to about 10% by weight on a solids basis.

Preferred organo-metal salts include copper(II) acetyl acetonate, copper(II) naphthenate, cobalt(II) acetylacetonate, zinc(II) naphthenate, zinc(II) ethylhexanoate, manganese (II) naphthenate, and cyclopentadienyl iron(II) dicarbonyl dimer. Each of these organo-metal salts is readily available from various sources, for example Strem Chemical Corp., Newburyport, Mass. Other preferred organo-metal salts include dibutyltin(IV) dilaurate, available from Atochem North America, Inc., Buffalo, N.Y.

Preferred phenolic compounds include nonyl phenol, bisphenol A, cresol, phenol, and catechol, each of which is readily available from various sources, including Aldrich Chemical Co., Milwaukee, Wis.

The composition when applied should have a viscosity of about 100 kcps to about 400 kcps.

Upon placing the semiconductor die 1 over the adhesive pattern with sufficient pressure, an adhesive fillet is created along the die edge. The die is typically placed at a pressure of about 0.5 to about 25 psi, and more typically about 1 to about 10 psi.

If desired, the adhesive compositions can contain thermally electrically conductive filler particles such a silver to guard against sparking and/or non conductive fillers. Other suitable fillers include alumina and silica. When present, the particles typically have particle size in the range of about 0.5 to about 150 microns and are present in amounts of about 40 to about 80 parts by weight based upon the weight of the resin composition.

The composition is subjected to actinic light either before or after the placement of the die in order to cause cross-linking of the composition and preventing bleed-out or spreading of the resin onto the wire bond pads.

The actinic radiation is preferably ultraviolet light radiation to energies ranging from about 100 to about 250 millijoules/$cm^2$ and more typically about 500 to about 1500 millijoules/$cm^2$. The exposure time is typically about 30 to about 120 sec.

The assembly after placement of the die and after exposure of the composition to actinic radiation is then post-baked at elevated temperature of about 140 to about 215° C. and, more typically from about 160 to about 180° C. for about 5 to about 30 minutes, and more typically for about 6 to about 12 minutes. This results in final hardening of the adhesive composition so as to provide the necessary robust adhesive bond.

The following non-limiting examples are intended to further illustrate the present invention. Unless otherwise specified, amounts are given in parts by weight (pbw).

|  | Examples | | | | |
| --- | --- | --- | --- | --- | --- |
|  | 1 | 2 | 3 | 4 | 5 |
| Cyanate Ester Arocy L-10 | 2 | 10 | 7.5 | 5 | 3 |
| Arocy B-30 | 8 |  | 3.6 | 5.3 | 7 |
| Epon 828 |  | 11 | 10 | 8.5 | 4 |
| ER1-4221 |  |  |  | 1.5 | 2 |
| Ebecryl |  | 0.5 |  |  |  |
| Neopentyl glycol diacrylate |  |  | 4 |  |  |
| Dipentaerythritol monohydroxy pentaacrylate (DPEMPA) |  | 4 |  |  |  |
| Ethoxylated trimethylopropane triacrylate (ETMPTA) |  |  | 2 |  |  |
| Nonyl Phenol | 0.2 | 0.2 | 0.3 | 0.2 | 0.3 |
| Irgacure 261 |  |  |  | 0.18 | 0.25 |
| Irgacure 651 |  | 0.6 | 0.5 |  |  |
| UVI-6974 | 0.35 |  |  |  |  |
| Cu Naphthenate (8% Cu) |  | 0.03 |  |  |  |
| Manganese Hexanoate (6% Mn) | 0.03 |  | 0.02 | 0.02 | 0.03 |
| Silver Flakes | 25 | 65 | 48 |  | 32 |
| Lauroyl peroxide |  | 0.1 |  |  |  |
| Silica (Spherical) Potters 5000E |  |  |  |  | 2.1 |
| Alumina |  |  |  | 34.5 |  |

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A photo curable die attach adhesive composition which comprises:
 1) a resin component comprising:
  a. an epoxy component including at least one polyepoxide resin curable by heat in an amount of about 25 to about 70% by weight,
  b. an olefinically unsaturated monomer component including at least one polyolefinically unsaturated monomer curable by actinic radiation in an amount of about 5 to about 30% by weight; and
  c. at least one cyanate ester in an amount of about 25 to about 50% by weight;
 2) at least one photoinitiator in an amount of about 0.1 to about 10% by weight of the resin component;
 3) at least one organic peroxide in an amount of about 0.2 to about 2% by weight of the resin component;
 4) at least one heat activated curing agent for accelerating reaction of said cyanate ester, epoxy and combination thereof, said heat activated curing agent being selected from the group consisting of organo-metal compounds, inorganic metal salts, phenolic compounds, solutions of organo-metal compounds in phenolic compounds and mixtures thereof in an amount of about 0.01 to about 1.0% by weight of the resin component; and which further contains a filler in an amount of about 40 to about 80% by weight based upon the resin component; wherein said adhesive composition exhibits dual curing characteristics and has a viscosity of about 100 kcps to about 400 kcps.

2. The adhesive composition of claim 1 wherein the amount of said epoxy component is about 30 to about 60% by weight; the amount of said unsaturated monomer component is about 15 to about 25% by weight; the amount of said photoinitiator is about 0.4 to about 1% by weight; and the amount of said heat actuated curing agent is about 0.5 to about 1% by weight.

3. The adhesive composition of claim 2 wherein said filler comprises thermally and electrically conductive filler particles.

4. The adhesive composition of claim 3 wherein said filler comprises silver.

5. The adhesive composition of claim 4 wherein said filler comprises silver flakes.

6. The adhesive composition of claim 2 wherein said filler comprises non-conductive fillers.

7. The adhesive composition of claim 2 wherein said filler comprises at least one of alumina and silica having particle size of about 0.5 to 150 microns.

8. The adhesive composition of claim 1 wherein said filler comprises thermally and electrically conductive filler particles.

9. The adhesive composition of claim 8 wherein said fillet comprises silver.

10. The adhesive composition of claim 9 wherein said filler comprises silver flakes.

11. The adhesive composition of claim 1 wherein said filler comprises non-conductive fillers.

12. The adhesive composition of claim 1 wherein said filler comprises at least one of alumina and silica having particle size of about 0.5 to 150 microns.

* * * * *